US 7,665,950 B2

(12) United States Patent
Uratani et al.

(10) Patent No.: US 7,665,950 B2
(45) Date of Patent: Feb. 23, 2010

(54) TRANSFER APPARATUS

(75) Inventors: Takafumi Uratani, Osaka (JP); Daisuke Sado, Osaka (JP); Hideki Matsuo, Osaka (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 12/150,144

(22) Filed: Apr. 25, 2008

(65) Prior Publication Data

US 2008/0273957 A1    Nov. 6, 2008

(30) Foreign Application Priority Data

Apr. 26, 2007    (JP) .............................. 2007-116524

(51) Int. Cl.
*B25J 18/04*    (2006.01)
(52) U.S. Cl. .................... 414/744.2; 74/490.04; 901/21
(58) Field of Classification Search .............. 414/744.1, 414/744.2, 744.3, 744.5; 901/15, 21; 74/490.01, 74/490.04
See application file for complete search history.

(56) References Cited

U.S. PATENT DOCUMENTS 5,135,349 A * 8/1992 Lorenz et al. ............ 414/744.6
7,264,436 B2 * 9/2007 Tillmann ................. 414/744.5
7,316,537 B2 * 1/2008 Park et al. ................ 414/744.1

FOREIGN PATENT DOCUMENTS

JP    2005-186259    7/2005

* cited by examiner

*Primary Examiner*—Donald Underwood
(74) *Attorney, Agent, or Firm*—Hamre, Schuman, Mueller & Larson, P.C.

(57)    ABSTRACT

A transfer apparatus includes a stationary base, a swivel rotatable around a vertical rotation axis, a linear movement mechanism supported by the swivel, a hand supported by the linear movement mechanism for transferring a work along a horizontal path, a driving power source in the stationary base, and a transmission shaft arranged along the rotation axis for transmitting driving force from the driving power source to the linear movement mechanism. The linear movement mechanism includes a driving mechanism and a guide rail for movably supporting the hand. The driving mechanism has a plurality of pulleys, including a driving pulley supported rotatably around a horizontal axis, and an output belt wound around the plurality of pulleys for reciprocal movement within a predetermined section extending parallel to the movement path. The hand is connected to the output belt via a connection member.

8 Claims, 11 Drawing Sheets

TRANSFER APPARATUS

BACKGROUND OF THE INVENTION

1. Field of the Invention

The present invention relates to a transfer apparatus. More particularly, the invention relates to a transfer apparatus for linearly transferring a work such as a substrate in the form of a thin plate.

2. Description of the Related Art

A transfer robot with a mechanism for moving a hand along a linear movement path (linear movement mechanism) has a simpler structure and is less expensive than the so-called articulated robot. Such a transfer robot is often used for carrying in or out a work in the form of a thin plate such as a wafer or a glass substrate with respect to a process chamber in manufacturing a semiconductor fabrication system or a liquid crystal display panel, for example.

An example of such a transfer apparatus for transferring a work in the form of a thin plate is disclosed in JP-A-2005-186259. The disclosed transfer apparatus includes a link arm mechanism as a linear movement mechanism supported by a rotary base. A hand for horizontally holding a work in the form of a plate such as a substrate is mounted to an end of the link arm mechanism. The rotary base is rotatably supported by a stationary base. When the rotary base rotates on the stationary base around a vertical rotation axis, the link arm mechanism rotates correspondingly. The stationary base incorporates a driving source for driving the link arm mechanism and a transmission shaft extending into the rotary base for transmitting the driving force from the driving source to the link arm mechanism. The link arm mechanism includes two links in the form of a parallelogram each including a plurality of arms connected rotatably. The link arm mechanism is driven by the driving force transmitted thereto from the driving source in the stationary base via the transmission shaft. When the link arm mechanism is driven, the work held by the hand moves linearly within a horizontal plane. In this way, the work is transferred from a certain position to another position.

In recent years, the size of a liquid crystal display panel is being increased, and accordingly, the work to be transferred by a transfer apparatus is being increased in size and weight. Further, the movement distance or travel of the hand for holding the work is required to be increased.

However, with the structure of the conventional transfer apparatus, the rigidity of the link arm mechanism needs to be increased to support a work having a large weight, which leads to an increase in weight of the link arm mechanism.

Moreover, to increase the travel of the hand, the length of the arm of the link arm mechanism needs to be increased. When the length of the arm is increased, the position of the link arm mechanism as a whole deviates to be away from the above-described rotation axis. Due to the positional deviation and the increase in weight of the link arm mechanism, a large inertial force is applied to the rotary base in starting or finishing the rotation of the rotary base. As a result, for the rotation, a driving source with a large output needs to be employed, which is not desirable.

SUMMARY OF THE INVENTION

An object of the present invention, which is proposed under the circumstances described above, is to provide a transfer apparatus which satisfies the need for an increase in the travel of a hand moved by a linear transfer mechanism without increasing the weight of the entire linear movement mechanism and the inertial force accompanying the rotation.

According to a first aspect of the present invention, there is provided a transfer apparatus comprising: a stationary base; a swivel supported by the stationary base to be rotatable around a vertical rotation axis; a linear movement mechanism supported by the swivel; a hand supported by the linear movement mechanism for transferring a work along a horizontal straight movement path by operation of the linear movement mechanism; a driving power source arranged in the stationary base; and a transmission shaft arranged along the rotation axis for transmitting driving force from the driving power source to the linear movement mechanism. The linear movement mechanism includes a driving mechanism and a guide rail for movably supporting the hand, where the driving mechanism comprises a plurality of pulleys, including a driving pulley supported rotatably around a horizontal axis, and an output belt wound around the plurality of pulleys to be contained in a vertical plane for reciprocal movement within a predetermined section extending parallel to the movement path. The hand is connected to the output belt via a connection member.

In a preferred embodiment, the driving mechanism includes a bevel gear mechanism arranged between the transmission shaft and the driving pulley.

In the transfer apparatus according to the present invention, the hand is supported by the guide rail and driven by the belt-type driving mechanism. With this arrangement, the travel of the hand can be easily increased by increasing the length of the guide rail and the output belt. Thus, an increase in weight of the linear movement mechanism due to an increase in the travel is reliably prevented.

In the driving mechanism, the output belt is wound around a plurality of pulleys including the driving pulley so as to lie within a vertical plane, and the driving force is transmitted from the transmission shaft to the driving pulley via the bevel gear mechanism. In this structure, the driving force transmission route including the bevel gear mechanism and the driving pulley is arranged efficiently adjacent to the rotation axis. Owing to this arrangement, an inertial force applied to the swivel in starting or finishing the rotation is properly prevented from increasing.

In a preferred embodiment, the bevel gear mechanism includes a first bevel gear mounted to an end of the transmission shaft and a second bevel gear meshing with the first bevel gear for transmitting the rotation of the transmission shaft to the driving pulley.

In the above-described structure, the first bevel bear constituting the bevel gear mechanism is mounted to an end of the transmission shaft. With this arrangement, the bevel gear mechanism and the driving pulley are located adjacent to the rotation axis, which is advantageous for preventing the inertial force to be applied to the swivel from increasing.

In a preferred embodiment, the driving mechanism further comprises a rotation shaft extending parallel to the rotation axis and a transmission section for transmitting the rotation of the transmission shaft to the rotation shaft. The bevel gear mechanism includes a first bevel gear mounted to an end of the rotation shaft and a second bevel gear meshing with the first bevel gear for transmitting the rotation of the rotation shaft to the driving pulley. Preferably, in this case, the swivel includes an upper portion and a lower portion connected to each other to be vertically separable, and the transmission section includes a linkage member supported by the upper portion rotatably around the rotation axis and an engagement member brought into engagement with the transmission shaft from above and removably connected to the linkage member.

With the above-described structure, the transfer apparatus can be separated into an upper portion and a lower portion as required, which facilitates the handling of the apparatus in e.g. installing. That is, even when the length of the linear movement mechanism is increased to increase the length of the movement path, the handling of the transfer apparatus in e.g. installing is easy, because the linear movement mechanism can be separated while being supported by the upper portion of the swivel.

In a preferred embodiment, the hand may include a first and a second hands which are movable along the movement path without interfering with each other. The driving mechanism may include a first driving mechanism and a second driving mechanism for driving the first hand and the second hand, respectively. The transmission shaft may include a first transmission shaft and a second transmission shaft coaxially arranged correspondingly to the first and the second driving mechanisms. The bevel gear mechanism may include a first and a second bevel gear mechanisms structured correspondingly to the first and the second driving mechanisms and the first and the second transmission shafts.

The transfer apparatus having the above-described structure is suitably applicable to a two-arm transfer apparatus including two hands driven individually.

In a preferred embodiment, one of the first and the second transmission shafts is inserted in the other one of the first and the second transmission shafts.

In a preferred embodiment, the transfer apparatus further comprises a deceleration mechanism arranged between the second bevel gear and the driving pulley.

DETAILED DESCRIPTION OF THE PREFERRED EMBODIMENTS

Preferred embodiments of the present invention will be described below with reference to the accompanying drawings.

Figure 1:
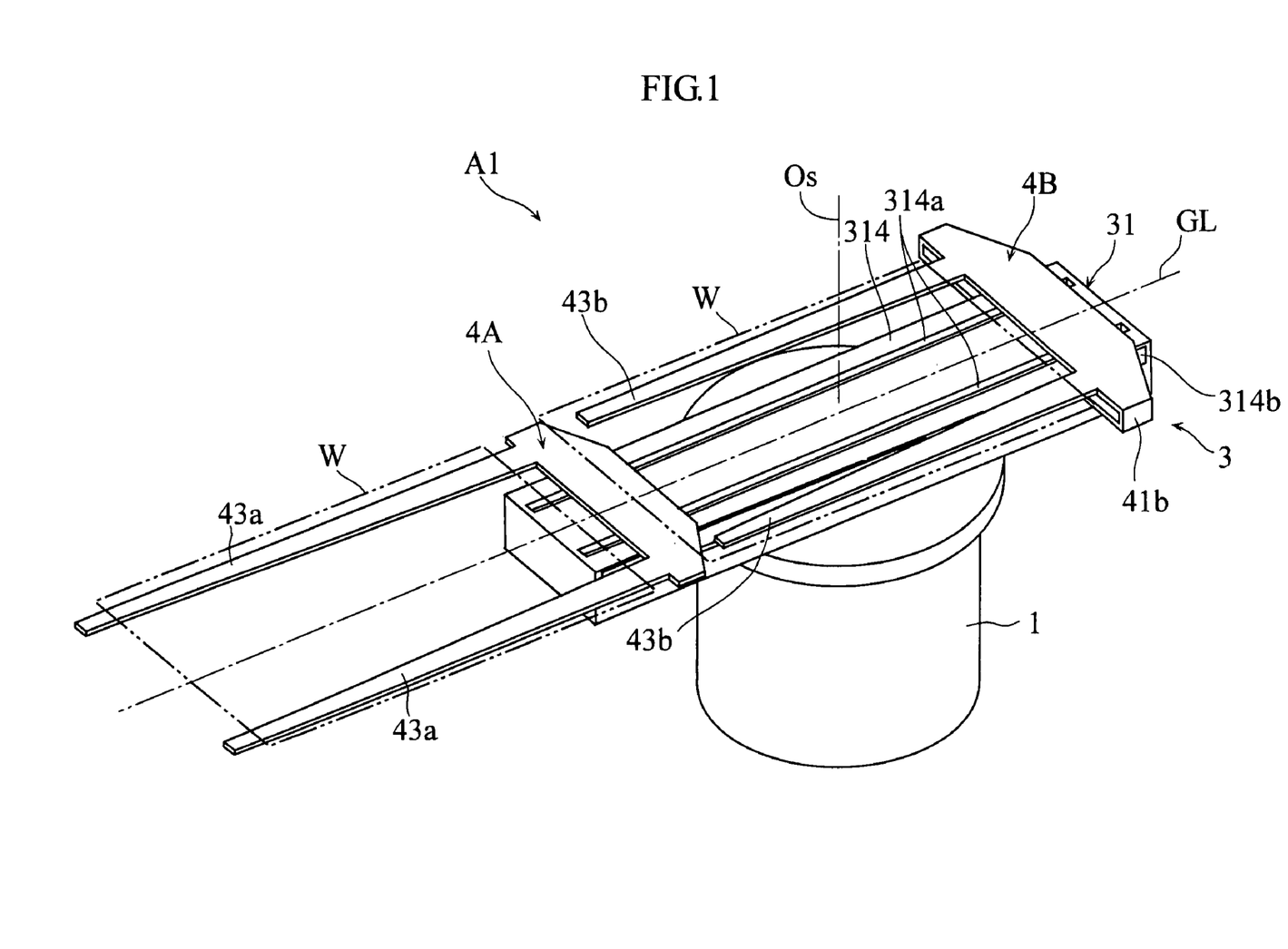
FIG. 1 is an overall perspective view showing a transfer apparatus according to a first embodiment of the present invention.
Figure 2:
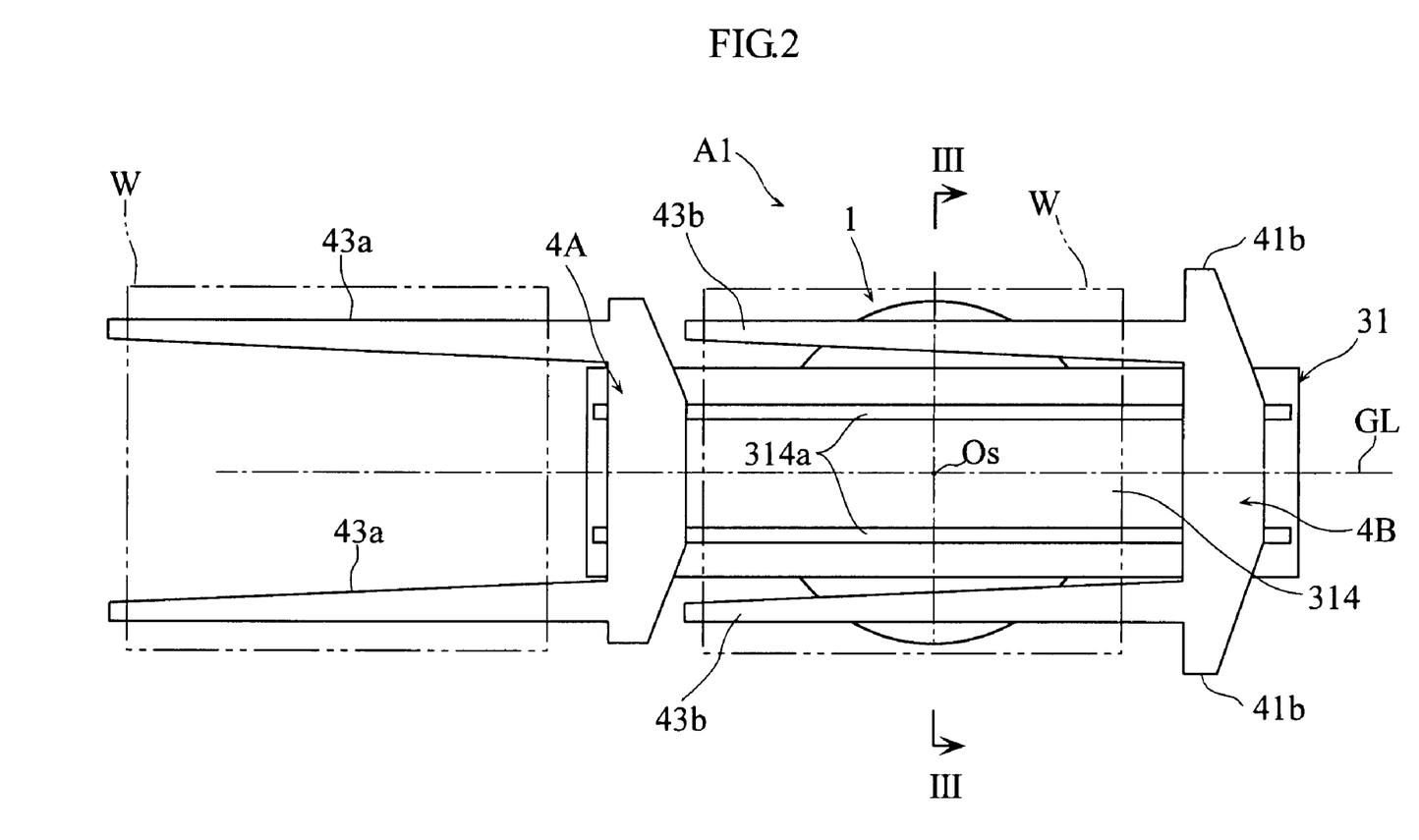
FIG. 2 is a plan view showing the transfer apparatus of FIG. 1.
Figure 3:
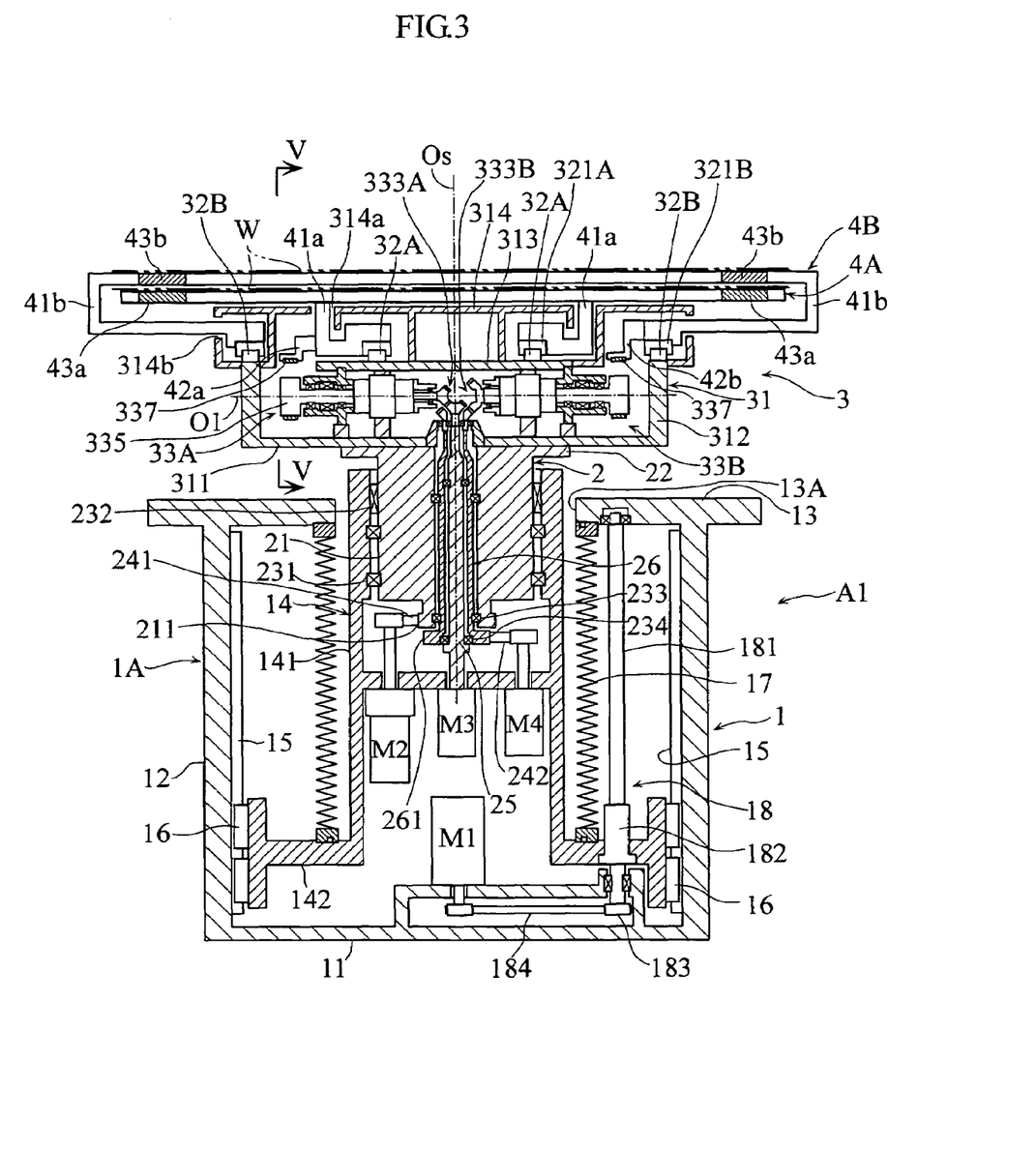
FIG. 3 is a sectional view taken along lines III-III in FIG. 2.

FIGS. 1-5 show a transfer apparatus according to a first embodiment of the present invention. The transfer apparatus A1 is used for transferring a work W in the form of a thin plate such as a substrate for a liquid crystal display panel. As shown in FIGS. 1-3, the transfer apparatus A1 includes a stationary base 1, a swivel 2 supported by the stationary base 1 rotatably around a vertical rotation axis Os, a linear movement mechanism 3 supported by the swivel 2, and a pair of hands 4A and 4B individually supported by the linear movement mechanism 3. The hands 4A and 4B serve to hold a work W in the form of a thin plate in a horizontal posture.

As better shown in FIG. 3, the stationary base 1 includes a housing 1A having a generally columnar outer configuration made up of a bottom wall 11, a cylindrical side wall 12 and a top wall 13. The top wall 13 is formed with a center opening 13A.

The stationary base 1 supports therein an elevator base 14. The elevator base 14 has an outer diameter which is smaller than the center opening 13A and includes a cylindrical portion 141 having a predetermined dimension in the vertical direction and an outward flange 142 formed at the lower end of the cylindrical portion 141. The inner surface of the side wall 12 of the housing 1A is formed with a plurality of linear guide rails 15 extending in the vertical direction. A plurality of guide members 16 are provided at the outward flange 142 of the elevator base 14 to be slidable in the vertical direction relative to the linear guide rails 15. With this arrangement, the elevator base 14 is vertically movable relative to the stationary base 1 within a predetermined range. In this movement, the upper part of the cylindrical portion 141 of the elevator base 14 projects from the center opening 13A of the housing 1A.

A bellows 17 is arranged to surround the cylindrical portion 141 of the elevator base 14, and the opposite ends of the bellows 17 are connected to the top wall 13 of the stationary base 1 and the outward flange 142 of the elevator base 14, respectively. The bellows 17 hermetically seals the space between the top wall 13 of the stationary base 1 and the outward flange 142 of the elevator base 14 even when the elevator base 14 moves vertically.

The stationary base 1 further incorporates a ball screw mechanism 18. The ball screw mechanism 18 includes a screw shaft 181 extending vertically and arranged rotatably outside the bellows 17, and a nut 182 held in thread engagement with the screw shaft 181 and fixed to the outward flange 142 of the elevator base 14 in a penetrating manner. A pulley 183 is mounted to the lower end of the screw shaft 181. The screw shaft 181 is connected to a motor M1 via a belt 184 wound around the pulley 183 and rotated in a normal and a reverse direction by the operation of the motor M1. By rotating the screw shaft 181 in this way, the elevator base 14 moves up and down.

As shown in FIG. 3, the swivel 2 includes a cylindrical shaft 21 and an upper plate 22 integrally connected to the upper end of the cylindrical shaft 21. The cylindrical shaft 21 is supported by the cylindrical portion 141 of the elevator base 14 via a bearing 231 to be rotatable around the rotation axis Os. Between the cylindrical portion 141 and the cylindrical shaft 21 is also interposed a sealing mechanism 232 positioned above the bearing 231. The sealing mechanism 232 serves to separate the inner space of the elevator base 14 positioned under the sealing mechanism 232 from the space above the sealing mechanism 232 to provide air tightness. The cylindrical shaft 21 has a lower end integrally formed with a pulley 211. A belt 241 is wound between the pulley 211 and a pulley mounted to the output shaft of a motor M2 supported within the cylindrical portion 141. With this arrangement, when the motor M2 is driven, the swivel 2 rotates around the rotation axis Os.

Figure 4:
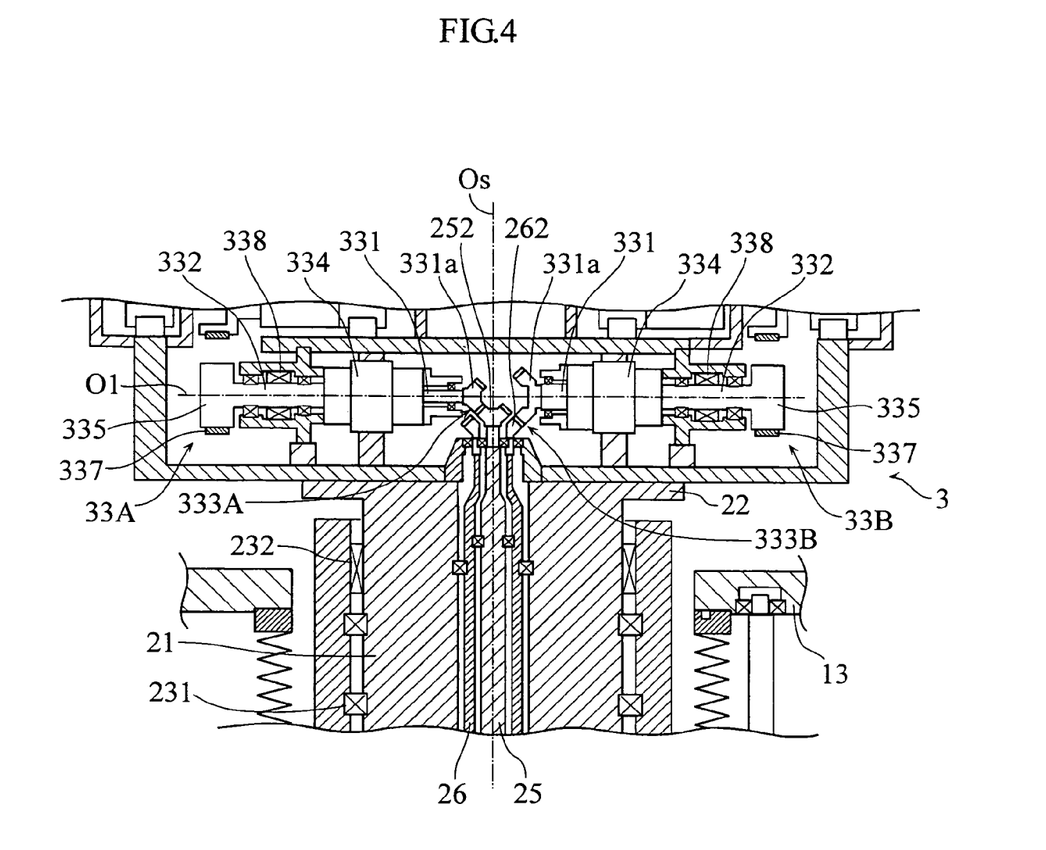
FIG. 4 is an enlarged view showing part of FIG. 3.

As shown in FIGS. 3 and 4, a first and a second transmission shafts 25 and 26 for transmitting driving force to a first and a second driving mechanisms 33A and 33B, which will be described later, are provided to extend within the cylindrical shaft 21 of the swivel 2 coaxially along the rotation axis Os. The second transmission shaft 26 is cylindrical and rotatably supported within the cylindrical shaft 21 via a bearing 233. The first transmission shaft 25 is rotatably supported within the second transmission shaft 26 via a bearing 234. The lower end of the first transmission shaft 25 is connected to the output shaft of a motor M3 supported within the cylindrical portion 141. The upper end of the first transmission shaft 25 is provided with a bevel gear 252. The lower end of the second transmission shaft 26 is provided with a pulley 261. A belt 242 is wound between the pulley 261 and a pulley mounted to the output shaft of a motor M4 supported within the cylindrical portion 141. A bevel gear 262 is mounted to the upper end of the second transmission shaft 26.

The linear movement mechanism 3 serves to transfer the hands 4A, 4B along a horizontal straight movement path GL. As shown in FIG. 3, the linear movement mechanism 3 includes a guide member 31, a pair of inner guide rails 32A and a pair of outer guide rails 32B provided on the guide member 31, and the first and the second driving mechanism 33A, 33B for transmitting horizontal driving force to the hands 4A, 4B.

The guide member 31 is in the form of an elongated rectangle having a horizontally-extending longitudinal axis (movement path GL) and includes a bottom wall 311, side walls 312, an intermediate wall 313 and a cover 314. The guide member 31 is fixed to the upper plate 22 of the swivel 2 so that the guide member rotates when the swivel 2 rotates. The space between the bottom wall 311 of the guide member 31 and the upper plate 22 of the swivel 2 is hermetically sealed by a non-illustrated sealing member. The paired inner guide rails 32A are supported by the intermediate wall 313, whereas the paired outer guide rails 32B are supported by the side walls 312.

The hand 4A is supported by the inner guide rails 32A via a pair of support arms 41a formed on the lower surface thereof and a slider 321A provided on the support arms 41a. The hand 4B is supported by the outer guide rails 32B via a pair of support arms 41b formed outward the sides of the hands 4A and a slider 321B provided on the support arm 41b. The upper side of the guide rails 32A, 32B is covered by the cover 314. The support arms 41a of the hand 4A penetrate the cover 314 through slits 314a formed in the upper wall of the cover 314. The support arms 41a are provided with a connection member 42a. The connection member 42a penetrates through a slit formed in the intermediate wall 313 to be connected to an output belt 337 of the first driving mechanism 33A, which will be described later. The support arms 41b of the hand 4B penetrate the cover 314 through slits 314b formed in the side walls of the cover 314. The support arms 41b are provided with a connection member 42b. The connection member 42b penetrates through a slit formed in the intermediate wall 313 to be connected to an output belt 337 of the second driving mechanism 33B.

As better shown in FIGS. 1-3, the hands 4A and 4B are integrally formed with holder pieces 43a and 43b in the form of a fork extending in the longitudinal direction of the guide member 31. The holder pieces 43a, 43b are utilized for holding a work W in the form of a thin plate placed thereon. Unlike FIGS. 1 and 2, FIGS. 3 and 5 show the state in which both of the hands 4A and 4B are positioned above the stationary base 1.

The first and the second driving mechanism 33A and 33B serve to move the hands 4A and 4B individually along the movement path GL. The first and the second driving mechanism 33A and 33B basically have the same structure. Thus, only the structure of the first driving mechanism 33A will be described below, and the description of the second driving mechanism 33B will be omitted appropriately.

Figure 5:
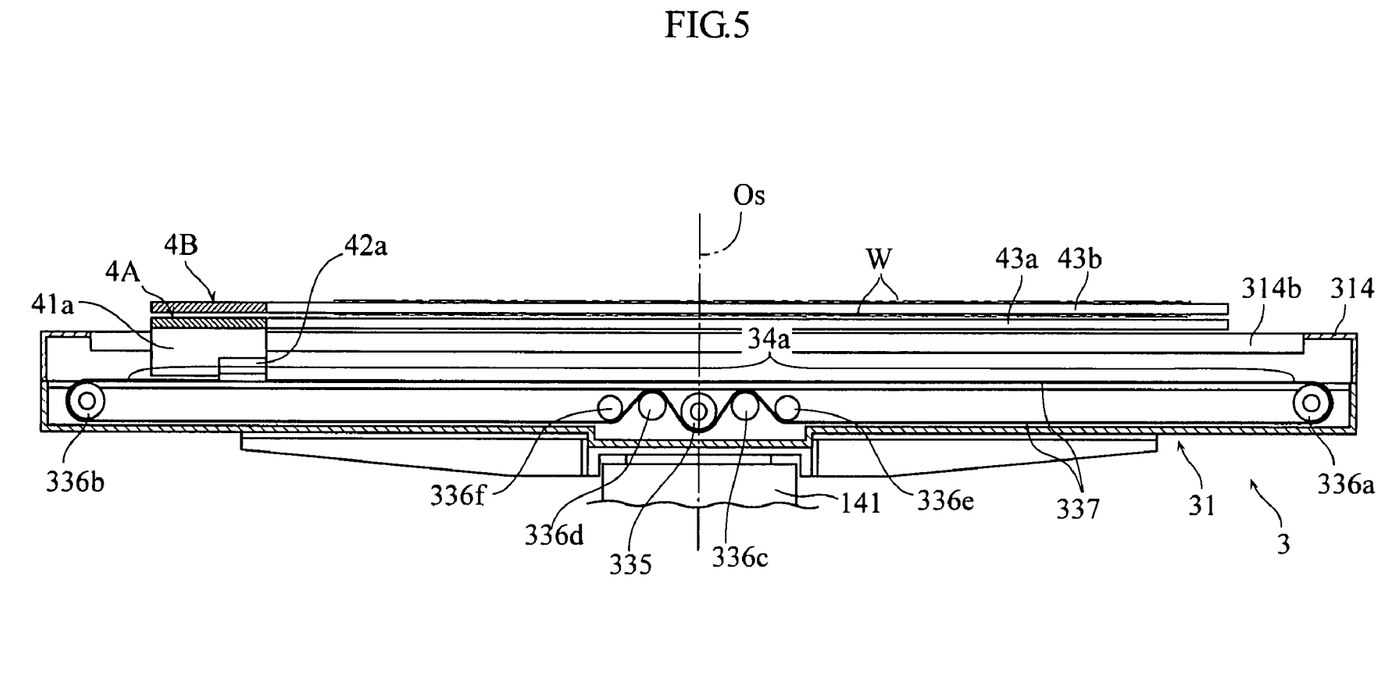
FIG. 5 is a sectional view taken along lines V-V in FIG. 3.

As better shown in FIGS. 3-5, the first driving mechanism 33A includes transmission shafts 331, 332, a bevel gear mechanism 333A, a deceleration mechanism 334, a driving pulley 335, pulleys 336a-336f and an output belt 337. The first driving mechanism 33A is accommodated in the guide member 31. The transmission shaft 331 is supported by the guide member 31 rotatably around a horizontal axis O1 extending perpendicularly to the rotation axis Os. A bevel gear 331a is mounted to an end (right end in the figure) of the transmission shaft 331. The bevel gear 331a meshes with a bevel gear 252 mounted to an upper end of the first transmission shaft 25. The bevel gear mechanism 333A is made up of the bevel gears 252 and 331a and converts the rotation of the first transmission shaft 25 around the rotation axis Os into the rotation around the horizontal axis O1 to transmit the rotation to the driving pulley 335. The other end of the transmission shaft 331 is connected to the input shaft of the deceleration mechanism 334.

The transmission shaft 332 is supported by the guide member 31 rotatably around the horizontal axis O1. An end of the transmission shaft 332 is connected to the output shaft of the deceleration mechanism 334. The driving pulley 335 is mounted to the other end (left end in the figure) of the transmission shaft 332. A sealing mechanism 338 intervenes between the transmission shaft 332 and the guide member 31. By the provision of the sealing mechanism 338, the inner space of the elevator base 14 communicating with the inside of the guide member 31 via the swivel 2 is hermetically sealed from the outside. A coupling joint (not shown) may be provided as required between the transmission shaft 331 and the transmission shaft 332.

As shown in FIG. 5, each of the pulleys 336a-336f is arranged in the guide member 31 to be rotatable around a horizontal axis. The output belt 337 is wound around the driving pulley 335 and the pulleys 336a-336f to lie within a vertical plane. The pulleys 336a and 336b are provided adjacent to the ends of the guide member 31 which are opposite in the longitudinal direction (the direction along the movement path GL). The pulleys 336c, 336d, 336e, 336f are provided adjacent to the driving pulley 335, and the pulleys 336c and 336d are arranged outside the output belt 337. Thus, appropriate tension is applied to the output belt 337. As the output belt 337, a timing belt may be suitably used.

With the above-described arrangement, when the motor M3 is driven, the rotational driving force of the motor M3 is transmitted to the first driving mechanism 33A via the first transmission shaft 25. In the driving mechanism 33A, the rotation around the rotation axis Os is converted into the rotation around the horizontal axis O1 by the bevel gear mechanism 333A, and deceleration is performed by the deceleration mechanism 334, whereby the driving pulley 335 is rotated. In accordance with the rotation of the driving pulley 335, the output belt 337 reciprocates within a predetermined vertical plane.

The pulleys 336a and 336b are arranged along a line extending parallel to the movement path GL. In FIG. 5, the region of the output belt 337 which is positioned above the pulleys 336a and 336b is a section 34a extending parallel to the movement path GL, and the output belt 337 reciprocates within the section 34a. The connection member 42a extending from the support arm 41a of the hand 4A is connected to a predetermined portion of the section 34a of the output belt 337. With this arrangement, by the operation of the first driving mechanism 33A, the hand 4A slides horizontally along the movement path GL while being supported by the two inner guide rails 32A.

As shown in FIG. 4, the transmission shafts 331 and 332 of the second driving mechanism 33B are arranged to face the transmission shafts 331 and 332 of the first driving mechanism 33A across the rotation axis Os and rotatable around the horizontal axis O1. A bevel gear 331a is mounted to an end (left end in the figure) of the transmission shaft 331. The bevel gear 331a meshes with a bevel gear 262 mounted to an upper end of the second transmission shaft 26. The bevel gears 262 and 331a constitute a bevel gear mechanism 333B.

With the above-described arrangement, when the motor M4 is driven, the rotational driving force of the motor M4 is transmitted to the second driving mechanism 33B via the belt 242 and the second transmission shaft 26. In the driving mechanism 33B, the rotation around the rotation axis Os is converted into the rotation around the horizontal axis O1 by the bevel gear mechanism 333B, and deceleration is performed by the deceleration mechanism 334, whereby the driving pulley 335 is rotated. In accordance with the rotation of the driving pulley 335, the output belt 337 reciprocates within a predetermined vertical plane. The connection member 42b extending from the support arm 41b of the hand 4B is connected to a predetermined portion of the output belt 337. With this arrangement, by the operation of the second driving mechanism 33B, the hand 4B slides horizontally along the movement path GL while being supported by the two outer guide rails 32B.

For instance, the transfer apparatus A1 having the above-described structure may be used for carrying in or out a work relative to a process chamber in the process of manufacturing a liquid crystal display panel. In this case, for instance, the transfer apparatus A1 may be placed in a transport chamber in a vacuum atmosphere around which a plurality of process chambers are arranged.

In recent years, the size of a liquid crystal display panel is being increased, and accordingly, the movement distance or travel of the hands 4A and 4B needs to be increased. In the transfer apparatus A1 of this embodiment, the hands 4A and 4B are supported by the guide rails 32A and 32B and moved by the belt-type driving mechanism 33A and 33B. Thus, the travel of the hands 4A, 4B can be easily increased by increasing the length of the guide rails 32A, 32B and the output belt 337. Thus, unlike the linear movement mechanism comprising a link arm mechanism, an increase in weight of the linear movement mechanism 3 due to an increase in the travel is reliably prevented.

In the transfer apparatus A1, the motors M3 and M4, which are the driving power source of the first and the second driving mechanism 33A and 33B, are arranged in the elevator base 14 (stationary base 1) which does not rotate. Thus, the wires of the motors M3 and M4 do not need to be arranged in the swivel 2. Thus, the swivel 2 can be rotated endlessly, so that the transfer of works W can be performed properly, whereby the manufacturing efficiency is enhanced.

In the first and the second driving mechanisms 33A and 33B, the transmission of the driving force from the first and the second transmission shafts 25, 26 to the driving pulleys 335 is performed via the bevel gear mechanisms 333A, 333B, and the output belts 337 are wound around to lie within a vertical plane. With this arrangement, the driving force transmission route extending from the bevel gear mechanisms 333A, 333B to the driving pulleys 335 is arranged efficiently adjacent to the rotation axis Os. Owing to this arrangement, while the belt system which is capable of increasing the travel of the hands 4A, 4B is employed, an inertial force applied to the swivel 2 in starting or finishing the rotation of the swivel 2 is properly prevented from increasing. As a result, as the motor M2 for rotation, a motor with a relatively small output can be employed, whereby space and power are saved.

The bevel gears 252 and 262 constituting the bevel gear mechanisms 333A and 333B are provided on the upper ends of the first and the second transmission shaft 25 and 26, respectively. This arrangement ensures that the driving pulleys 335 are arranged adjacent to the rotation axis Os, which is advantageous for preventing the inertial force applied on the swivel 2 from increasing. Further, although a deceleration mechanism generally has a relatively large weight, the deceleration mechanism 334 in this embodiment is arranged between the bevel gear 331a and the driving pulley 335 and positioned relatively close to the rotation axis Os. Thus, even with the provision of the deceleration mechanisms 334 for the driving mechanisms 33A and 33B, the inertial force applied on the swivel 2 is properly prevented from increasing.

Figure 6:
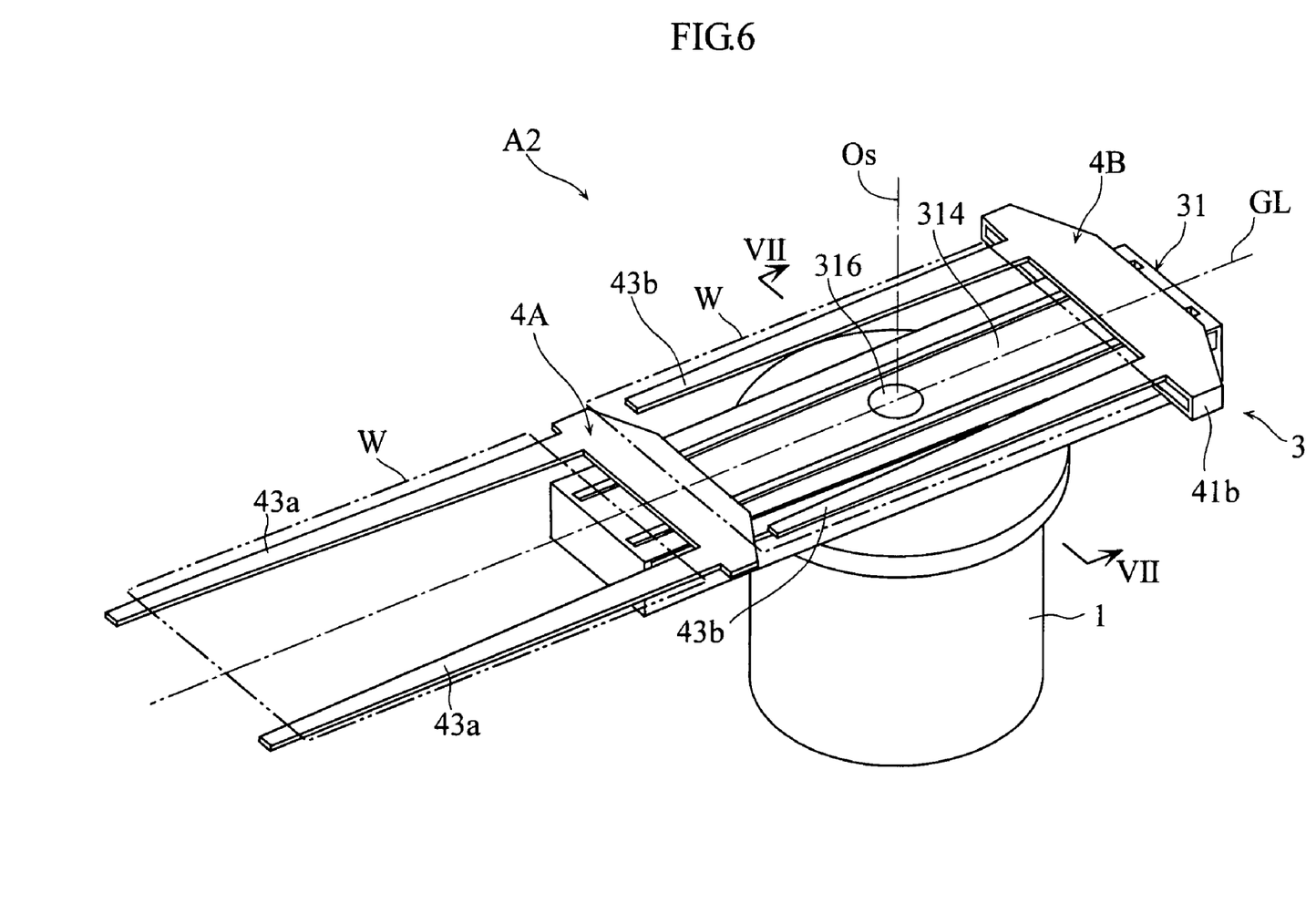
FIG. 6 is an overall perspective view showing a transfer apparatus according to a second embodiment of the present invention.

FIGS. 6-11 show a transfer apparatus A2 according to a second embodiment of the present invention. In FIG. 6 and the subsequent drawings, the elements which are identical or similar to those of the first embodiment are designated by the same reference signs as those used for the first embodiment, and description thereof will be omitted appropriately.

Figure 7:
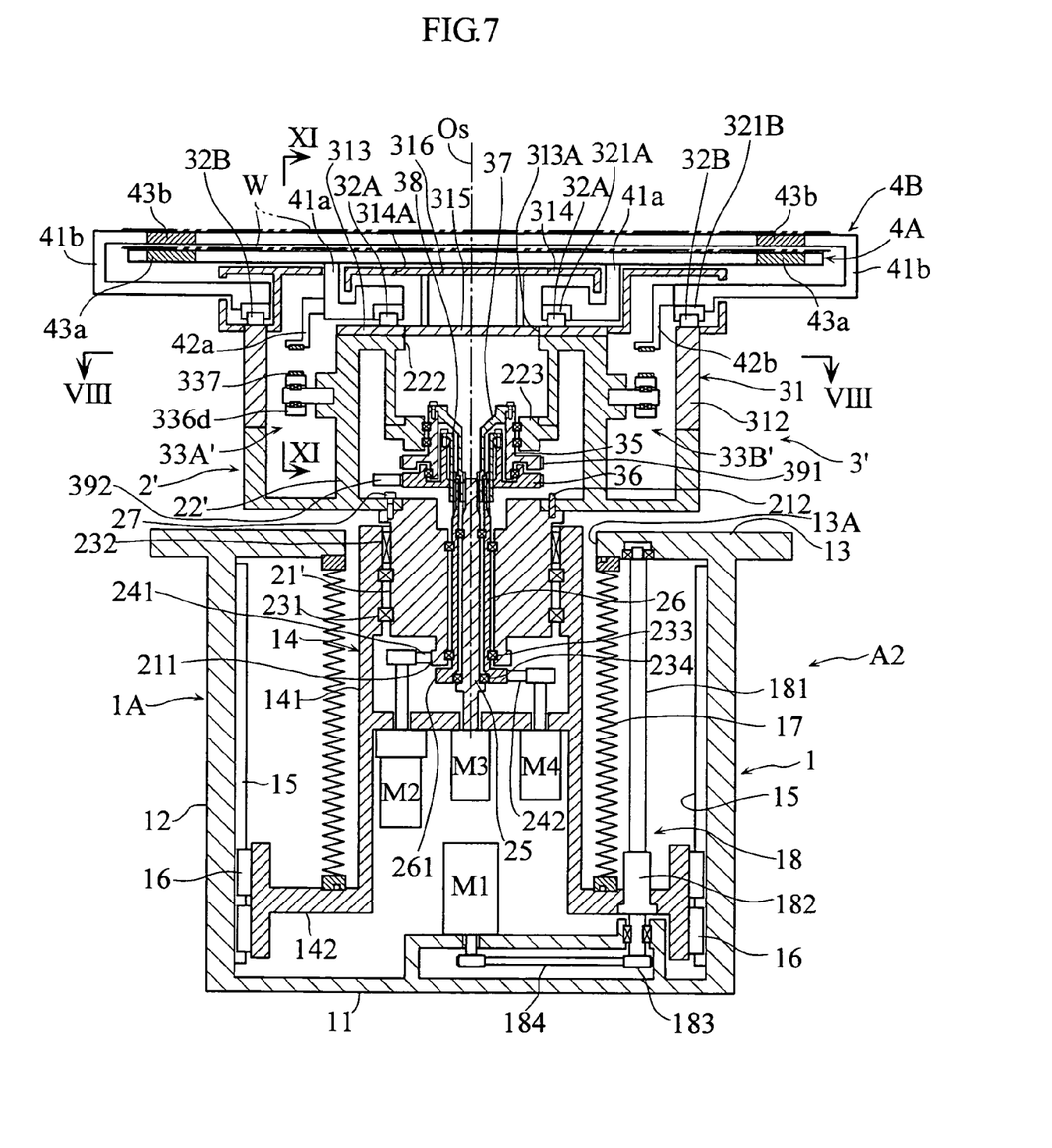
FIG. 7 is a sectional view taken along lines VII-VII in FIG. 6.
Figure 11:
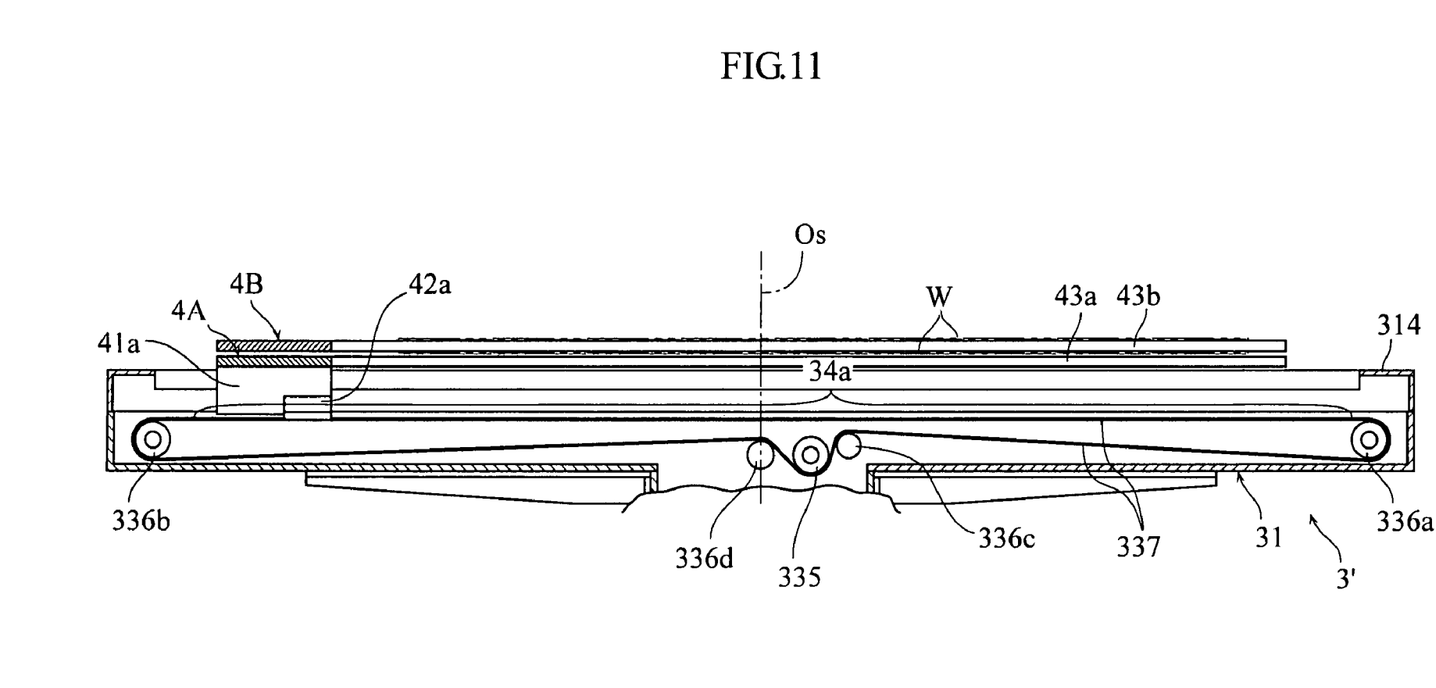
FIG. 11 is a partial sectional view taken along lines XI-XI in FIG. 7.

As shown in FIGS. 6 and 7, the transfer apparatus A2 of this embodiment includes a stationary base 1, a swivel 2', a linear movement mechanism 3' and a pair of hands 4A and 4B. Similarly to the transfer apparatus A1 of the first embodiment, the transfer apparatus A2 is used for transferring a work W in the form of a thin plate along a straight movement path GL. Unlike FIG. 6, FIGS. 7 and 11 show the state in which both of the hands 4A and 4B are positioned above the stationary base 1.

The transfer apparatus A2 of this embodiment is separable into an upper portion and a lower portion. Accordingly, the structure of the swivel 2' and the linear movement mechanism 3' of the transfer apparatus A2 differs from that of the transfer apparatus A1 of the first embodiment.

As better shown in FIG. 7, the swivel 2' includes a cylindrical shaft 21' (lower portion) and a housing 22' (upper portion) connected to the upper end of the cylindrical shaft 21'. The cylindrical shaft 21' and the housing 22' are connected to each other via a plurality of bolts 27 (only one is shown in FIG. 7) and vertically separable. When the housing 22' is connected to the cylindrical shaft 21', the space between the cylindrical shaft 21' and the housing 22' is hermetically sealed by a non-illustrated sealing member. The upper end of the cylindrical shaft 21' is provided with a plurality of positioning knock pins 212 (only one is shown in FIG. 7). The knock pins 212 are fitted in holes 221 formed in the housing 22'.

Figure 9:
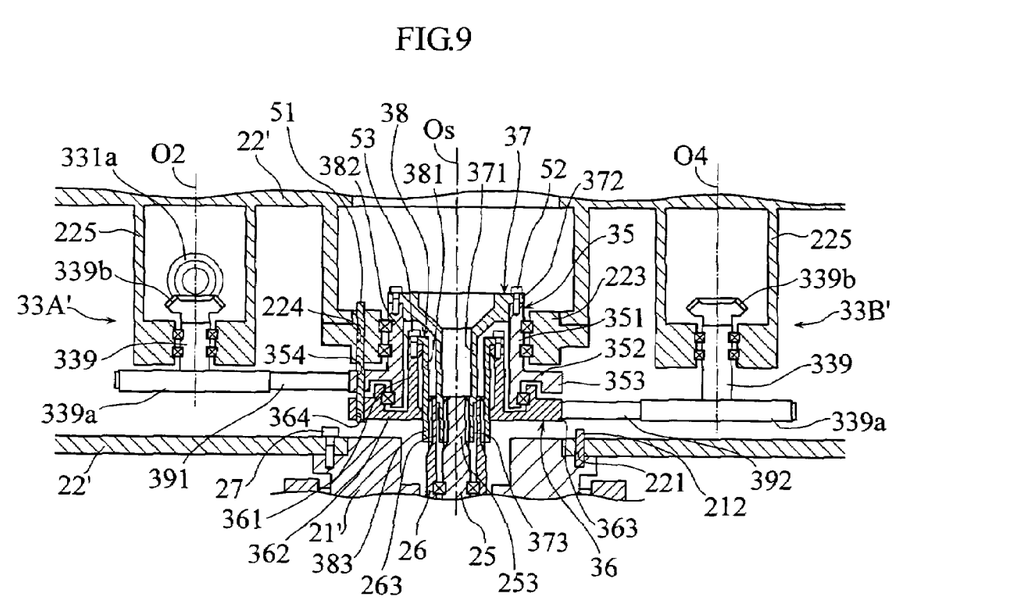
FIG. 9 is a partial sectional view taken along lines IX-IX in FIG. 8.

The housing 22' accommodates part of the driving mechanisms 33A' and 33B', which will be described later. The housing 22' is formed with an opening 222 at the center of the upper portion thereof, and an annular support member 223 is connected to the housing 22' at a portion below the opening 222. As shown in FIG. 9, the support member 223 is formed with a through-hole 224 extending parallel to the rotation axis Os.

The structure of the upper ends of the first and the second transmission shafts 25 and 26 differs from that of the first embodiment. Specifically, as better shown in FIG. 9, the respective upper ends of the first and the second transmission shafts 25 and 26 are provided with spline shafts 253 and 263, instead of the bevel gears 252 and 262.

The linear movement mechanism 3' includes a guide member 31, guide rails 32A, 32B and a first and a second driving mechanisms 33A' and 33B'.

As shown in FIG. 7, the guide member 31 includes an intermediate wall 313 formed with an opening 313A at the center thereof. A lid 315 for hermetically closing the opening 313A is removably mounted to the opening 313A. The cover 314 is formed with an opening 314A at the center thereof. A lid 316 for closing the opening 314A is removably mounted to the cover 314. The guide member 31 is also fixed to the housing 22' of the swivel 2'.

The first and the second driving mechanisms 33A' and 33B' differ from the first and the second driving mechanisms 33A and 33B of the first embodiment in that the first and the second driving mechanisms 33A' and 33B' additionally include a first and a second linkage members 35 and 36, a first and a second engagement members 37 and 38, and rotation shafts 339. Since the first and the second driving mechanism 33A' and 33B' basically have the same structure, only the structure of the first driving mechanism 33A' will be described below, and the description of the second driving mechanism 33B' will be omitted appropriately.

As better shown in FIG. 9, the first and the second linkage members 35 and 36 are arranged coaxially with the support member 223 of the housing 22' along the rotation axis Os. The first linkage member 35 includes a cylindrical shaft 351 and a collar portion 352 projecting radially outward from the circumference of the cylindrical shaft 351 and is rotatably supported within the support member 223 via a bearing. The collar portion 352 extends within the plane of rotation of the first linkage member 35 and is positioned under the support member 223. A pulley 353 is provided around the collar portion 352. The collar portion 352 is formed with a through-hole 354 extending parallel to the rotation axis Os.

The second linkage member 36 includes a cylindrical shaft 361 and a collar portion 362 projecting radially outward from the circumference of the cylindrical shaft 361 and is rotatably supported by the cylindrical shaft 351 of the first linkage member 35 via a bearing. The cylindrical shaft 361 is positioned inward of the cylindrical shaft 351 of the first linkage member 35. The collar portion 362 extends within the plane of rotation of the second linkage member 36 and is positioned under the support member 223 and the collar portion 352. A pulley 363 is provided around the collar portion 362. The collar portion 362 is formed with a through-hole 364 extending parallel to the rotation axis Os.

The through-hole 224 of the support member 223 and the through-holes 354, 364 of the first and the second linkage members 35, 36 are so formed that the respective centers of the through-holes are positioned on the circles having a common center on the rotation axis Os. Thus, the through-holes 224, 354 and 364 are positioned on a straight line extending parallel to the vertical axis Os. Thus, by inserting a pin 51 into the through-holes 224, 354 and 364 as shown in FIG. 9, the rotation of the first and the second linkage members 35 and 36 relative to the support member 223 is prevented.

The first engagement member 37 is removably mounted to the upper end of the cylindrical shaft 351 of the first linkage member 35 via a mounting bolt 52. Specifically, the first engagement member 37 includes a cylindrical shaft 371 and an outward flange 372 formed on the upper end of the cylindrical shaft 371 to overlap the cylindrical shaft 351 of the first linkage member 35. The lower end of the cylindrical shaft 371 is formed with a boss 373 for engagement with the spline shaft 253 formed on the upper end of the first transmission shaft 25. Thus, the first engagement member 37 is brought into engagement with the first transmission shaft 25 from above.

The second engagement member 38 is removably mounted to the upper end of the cylindrical shaft 361 of the second linkage member 36 via a mounting bolt 53. Specifically, the second engagement member 38 includes a cylindrical shaft 381 and an outward flange 382 formed on the upper end of the cylindrical shaft 381 to overlap the cylindrical shaft 361 of the second linkage member 36. The lower end of the cylindrical shaft 381 is formed with a boss 383 for engagement with the spline shaft 263 formed on the upper end of the second transmission shaft 26. Thus, the second engagement member 38 is brought into engagement with the second transmission shaft 26 from above. Herein, the cylindrical shaft 381 is positioned outward of the cylindrical shaft 371 of the first engagement member 37 and inward of the cylindrical shaft 361 of the second linkage member 36. Thus, when the second engagement member 38 is removed from the second linkage member 36, a space corresponding to the thickness of the cylindrical shaft 381 is defined between the spline shaft 263 of the second transmission shaft 26 and the cylindrical shaft 361 of the second linkage member 36.

In the first driving mechanism 33A', the rotation shaft 339 is supported by a cylindrical support 225 extending downward from an upper portion of the housing 22' of the swivel 2' to be rotatable around the vertical axis O2. The vertical axis O2 is located at a position deviated from the rotation axis Os in the direction along the movement path GL. A pulley 339a is mounted to the lower end of the rotation shaft 339. A belt 391 is wound between the pulley 339a and the pulley 353 of the first linkage member 35. A bevel gear 339b is mounted to the upper end of the rotation shaft 339.

Figure 10:
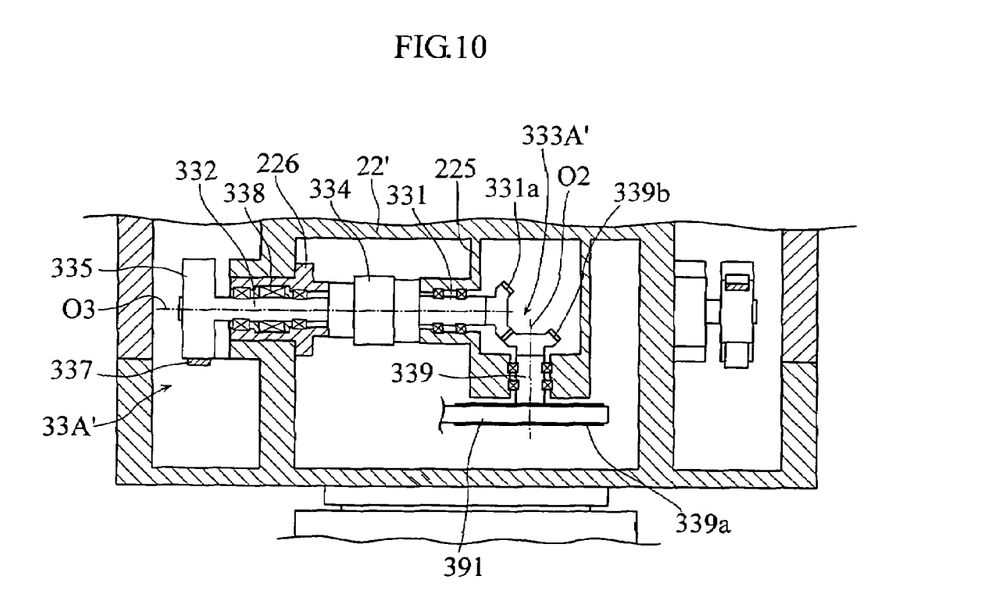
FIG. 10 is a partial sectional view taken along lines X-X in FIG. 8.

As better shown in FIG. 10, the transmission shaft 331 is supported by the support 225 rotatably around the horizontal axis O3. A bevel gear 331a is mounted to an end of the transmission shaft 331. The bevel gear 331a meshes with a bevel gear 339b mounted to an upper end of the rotation shaft 339. The bevel gears 339b and 331a constitute a bevel gear mechanism 333A'.

The transmission shaft 332 is supported by a support 226 mounted to the housing 22' to be rotatable around the horizontal axis O3. The space between the support 226 and the housing 22 is hermetically sealed by a non-illustrated sealing member.

Figure 8:
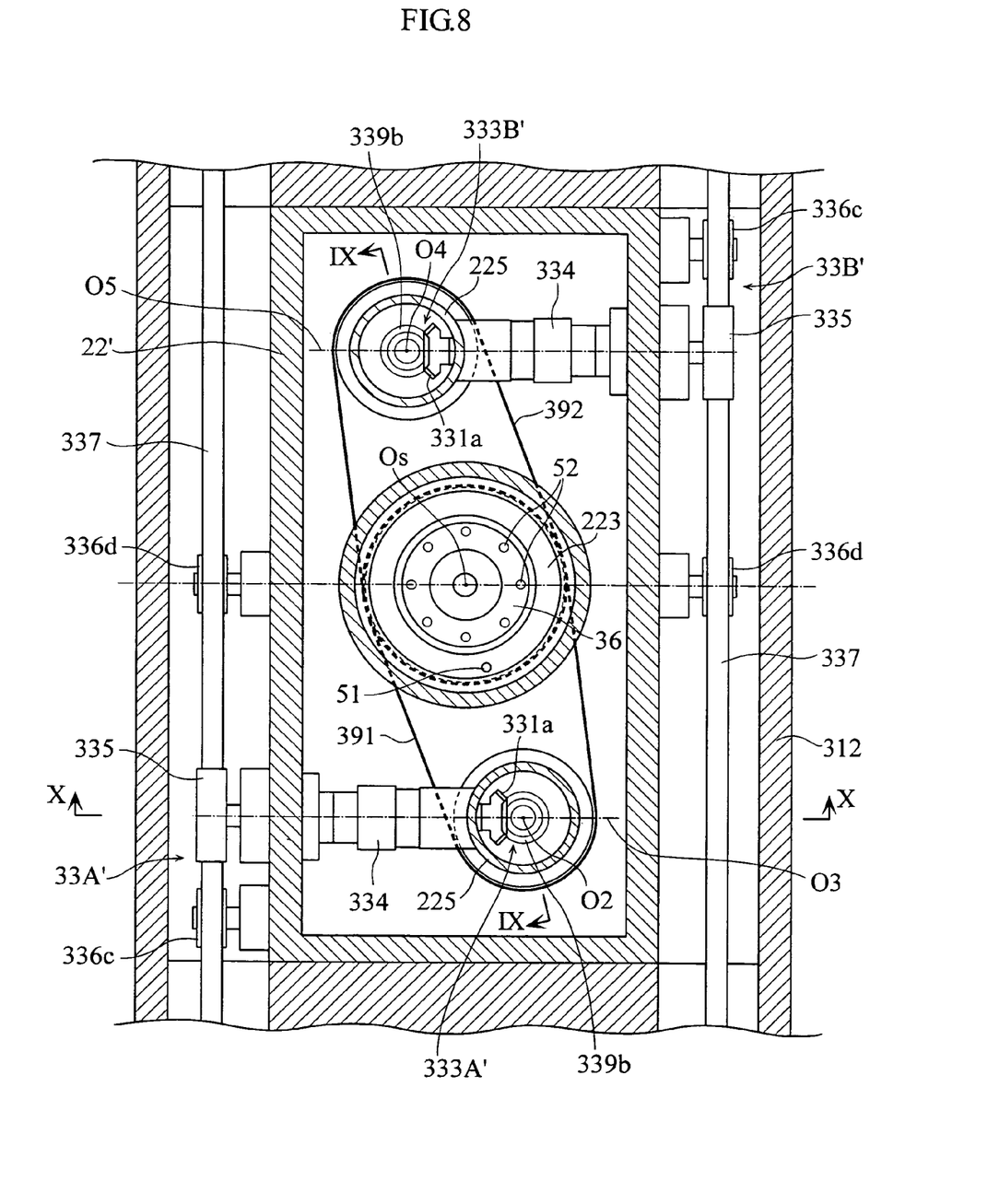
FIG. 8 is a sectional view taken along lines VIII-VIII in FIG. 7.

As better shown in FIG. 8 or 11, an output belt 337 is wound around a driving pulley 335 and pulleys 336a-336d. The pulleys 336a and 336b are provided adjacent to the ends of the guide member 31 which are opposite in the longitudinal direction (the direction along the movement path GL). The pulleys 336c and 336d are provided adjacent to the driving pulley 335 and outside the output belt 337. Thus, appropriate tension is applied to the output belt 337.

With the above-described arrangement, when the motor M3 is driven, the rotational driving force of the motor M3 is transmitted to the first driving mechanism 33A' via the first transmission shaft 25. In the driving mechanism 33A', the rotational driving force is transmitted to the bevel gear mechanism 333A' via the first engagement member 37, the first linkage member 35 and the belt 391. The rotation around the rotation axis Os is converted into the rotation around the horizontal axis O3 by the bevel gear mechanism 333A', and deceleration is performed by the deceleration mechanism 334, whereby the driving pulley 335 is rotated. In accordance with the rotation of the driving pulley 335, the output belt 337 reciprocates within a predetermined vertical plane. The connection member 42a extending from the support arm 41a of the hand 4A is connected to a predetermined portion of the output belt 337. With this arrangement, by the operation of the first driving mechanism 33A', the hand 4A slides horizontally along the movement path GL while being supported by the two inner guide rails 32A.

As shown in FIG. 9, in the second driving mechanism 33B', the rotation shaft 339 is supported rotatably around the vertical axis O4. The vertical axis O4 faces the vertical axis O2 across the rotation axis Os. A pulley 339a (right side in the figure) is mounted to the lower end of the rotation shaft 339. A belt 392 is wound between the pulley 339a and the pulley 363 of the second linkage member 36. A bevel gear 339b is mounted to the upper end of the rotation shaft 339. The transmission shaft 331 of the second driving mechanism 33B' is supported rotatably around the horizontal axis O5. A bevel gear 331a is mounted to an end of the transmission shaft 331. The bevel gear 331a meshes with the bevel gear 339b. The bevel gears 339b and 331a constitute a bevel gear mechanism 333B'.

When the motor M4 is driven, the rotational driving force of the motor M4 is transmitted to the second driving mechanism 33B' via the belt 242 and the second transmission shaft 26. In the driving mechanism 33B', the rotational driving force is transmitted to the bevel gear mechanism 333B' via the second engagement member 38, the second linkage member 36 and the belt 392. The rotation around the rotation axis Os is converted into the rotation around the horizontal axis O5 by the bevel gear mechanism 333B', and deceleration is performed by the deceleration mechanism 334, whereby the driving pulley 335 is rotated. In accordance with the rotation of the driving pulley 335, the output belt 337 reciprocates within a predetermined vertical plane. The connection member 42b extending from the support arm 41b of the hand 4B is connected to a predetermined portion of the output belt 337. With this arrangement, by the operation of the second driving mechanism 33B', the hand 4B slides horizontally along the movement path GL while being supported by the two inner guide rails 32B.

In the transfer apparatus A2 of this embodiment, the hands 4A and 4B are supported by the guide rails 32A and 32B and driven by the belt-type driving mechanism 33A' and 33B'. Thus, the travel of the hands 4A, 4B can be easily increased by increasing the length of the guide rails 32A, 32B and the output belt 337. Thus, unlike the linear movement mechanism comprising a link arm mechanism, an increase in weight of the linear movement mechanism 3' due to an increase in the travel is reliably prevented.

In the transfer apparatus A2, the motors M3 and M4, which are the driving power source of the first and the second driving mechanism 33A' and 33B', are arranged in the elevator base 14 which does not rotate. Thus, the swivel 2' can be rotated endlessly, so that the transfer of works W can be performed properly, whereby the manufacturing efficiency is enhanced.

In the first and the second driving mechanisms 33A' and 33B', the transmission of the power from the first and the second transmission shafts 25, 26 to the driving pulleys 335 is performed via the bevel gear mechanisms 333A', 333B', and the output belts 337 are wound around to lie within a vertical plane. With this arrangement, the driving force transmission route extending from the bevel gear mechanisms 333A', 333B' to the driving pulleys 335 is arranged efficiently adjacent to the rotation axis Os. Owing to this arrangement, while the belt system which is capable of increasing the travel of the hands 4A, 4B is employed, an inertial force applied to the swivel 2' in starting or finishing the rotation of the swivel 2' is properly prevented from increasing. As a result, as the motor M2 for rotation, a motor with a relatively small output can be employed, whereby space and power are saved.

As noted before, in e.g. installing the transfer apparatus A2 of this embodiment, the swivel 2' which rotates about the vertical axis Os can be separated into the housing 22' which is the upper portion and the cylindrical shaft 21' which is the lower portion, with the linear movement mechanism 3' supported.

Figure 12:
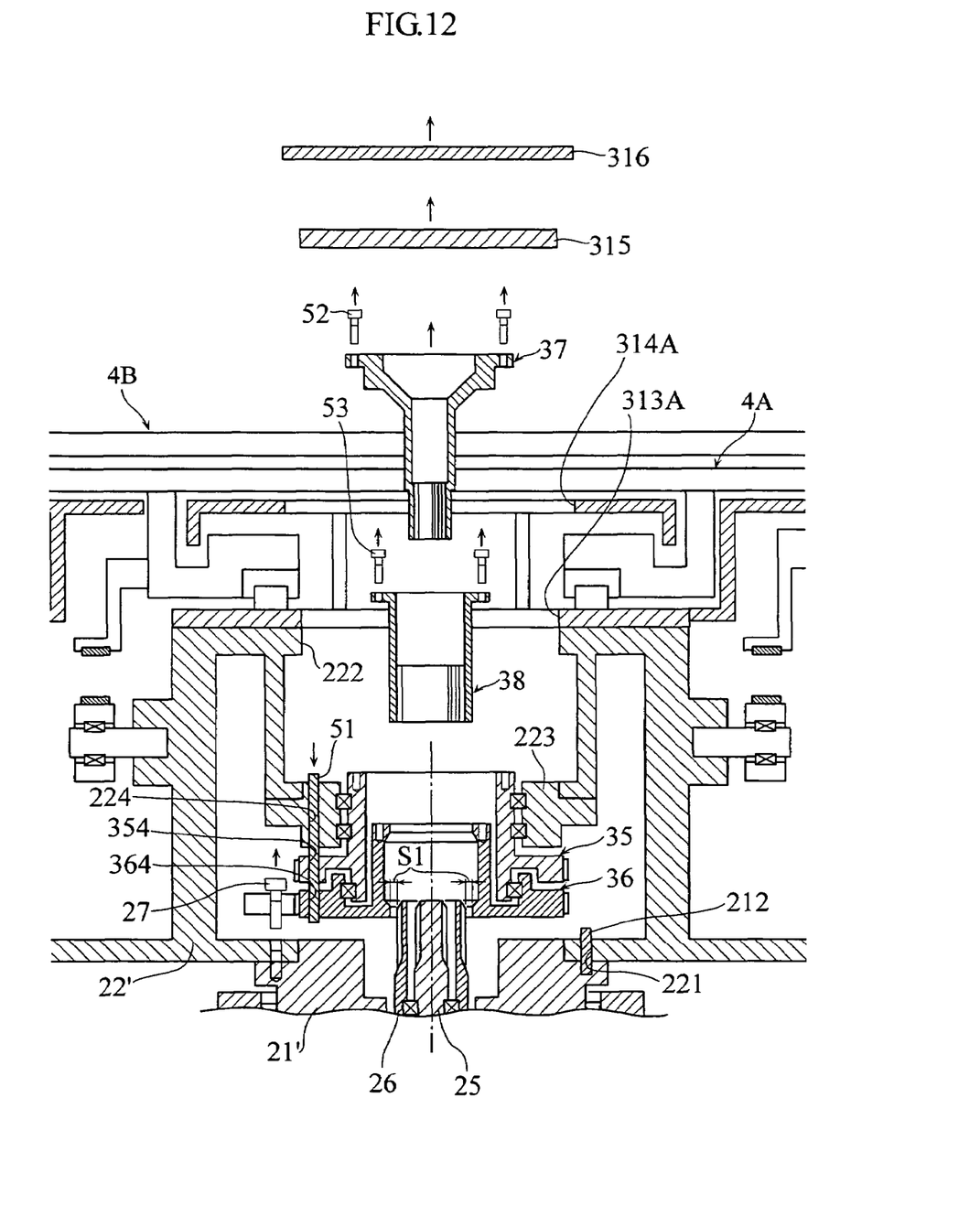
FIG. 12 is a sectional view for describing the separation process of the transfer apparatus according to the second embodiment of the present invention.

The separation of the housing 22' from the cylindrical shaft 21' may be performed by the process described below with reference to FIG. 12. First, with the support arms 41a, 41b of the hands 4A, 4B removed upward from the lid 316, the lids 316 and 315 are removed.

Then, the first and the second linkage members 35 and 36 are rotated relative to the support member 223 by driving the motors M3 and M4 so that the through-hole 224 of the support member 223 and the through-holes 354, 364 of the first and the second linkage members 35, 36 are aligned. In this state, the pin 51 is inserted into the through-holes 224, 354 and 364. Thus, the rotation of the first and the second linkage members 35 and 36 relative to the support member 223 is prevented.

Then, the first engagement member 37 is disengaged from the first linkage member 35 by loosening the mounting bolts 52 and pulled upward through the opening 222 of the housing 22' and the openings 313A, 314A of the guide member 31. As a result, the first transmission shaft 25 is disengaged from the first linkage member 35. Then, the second engagement member 38 is disengaged from the second linkage member 36 by loosening the mounting molts 53 and pulled upward through the opening 222 of the housing 22' and the openings 313A, 314A of the guide member 31. As a result, the second transmission shaft 26 is disengaged from the second linkage member 38.

Then, the cylindrical shaft 21' of the swivel 2' is disconnected from the housing 22' by loosening the bolts 27.

Then, by bringing a non-illustrated hook into engagement with an upper portion of the guide member 31 and pulling up the hook, for example, the housing 22' of the swivel 2' and the linear movement mechanism 3' supported by the housing 22' are removed as an integral part from the stationary base 1.

The cylindrical shaft 21' (lower portion) and the housing 22' (upper portion) can be connected to each other by performing the above-described process in the reversed order. Specifically, first, the housing 22' is placed on the cylindrical shaft 21' and connected to the cylindrical shaft 21' by tightening the bolts 27. In this step, by the use of the knock pins 212, the housing 22' is positioned accurately relative to the cylindrical shaft 21', so that the positional relationship between the cylindrical shaft 21' and the housing 22' becomes substantially the same as that before the separation. Then, the second engagement member 38 is mounted to the second linkage member 36, and then, the first engagement member 37 is mounted to the first linkage member 35. Then, the pin 51 is removed to make the first and the second linkage members 35 and 36 rotatable relative to the support member 223.

In the transfer apparatus A2 having the above-described structure, the linear movement mechanism 3' can be separated while being supported by the housing 22' of the swivel 2' even when the longitudinal dimension of the linear movement mechanism 3' including the guide member 31 and the guide rails 32A, 32B is increased to increase the travel of the hands 4A, 4B. Thus, the handling of the transfer apparatus A2 in e.g. installing is easy.

When the first and the second engagement members 37, 38 are removed from the transfer apparatus A2, a space S1 corresponding to the thickness of the cylindrical shaft 381 of the second engagement member 38 is defined between the second transmission shaft 26 and the second linkage member 36 in the circumferential direction of the vertical axis Os. Thus, in moving the housing 22' (upper portion) of the swivel 2' vertically to remove or connect the housing 22' relative to the cylindrical shaft 21' (lower portion), the second transmission shaft 26 and the second linkage member 38 are prevented from coming into contact with each other, and hence, prevented from wrenching or deforming.

As noted before, in removing the housing 22' (upper portion) of the swivel 2' from the cylindrical shaft 21' (lower portion), the first and the second linkage members 35 and 36 are fixed to the housing 22' so as not to rotate by inserting the pin 51 into the through-holes 224, 354, 364 of the support member 223 and the first and the second linkage members 35, 36. In this state, the rotation of the first and the second transmission shafts 25, 26 is stopped by the braking function of the motors M3, M4. Thus, in mounting the first and the second engagement members 37, 38 to the first and the second linkage members 35, 36, the positional relationship between the first linkage member 35 and the first transmission shaft 25 and that between the second linkage member 36 and the second transmission shaft 26 do not change. Thus, in mounting the first and the second engagement members 37 and 38, adjustment such as positioning is not necessary, which facilitates the handling of the apparatus.

Although the preferred embodiments of the present invention are described above, the present invention is not limited thereto. The specific structure of each part of the transfer apparatus according to the present invention may be varied in various ways without departing from the spirit of the invention.

For instance, the hand for carrying a work does not necessarily have the structure including two hands 4A and 4B like the foregoing embodiments but may have a one-hand structure.

Although the output belt 337 of the foregoing embodiments comprises a timing belt, the present invention is not limited thereto. For example, the output belt may comprise a flat belt or a steel belt or may be made of a wire.

Although the foregoing embodiments are described on the assumption that the transfer apparatus is to be used in a vacuum atmosphere, the transfer apparatus according to the present invention may be designed for use under atmospheric pressure.

The invention claimed is:

1. A transfer apparatus comprising:
   a stationary base;
   a swivel supported by the stationary base to be rotatable around a vertical rotation axis;
   a linear movement mechanism supported by the swivel;
   a hand supported by the linear movement mechanism for transferring a work along a horizontal straight movement path by operation of the linear movement mechanism;
   a driving power source arranged in the stationary base; and
   a transmission shaft arranged along the rotation axis for transmitting driving force from the driving power source to the linear movement mechanism;
   wherein the linear movement mechanism includes a driving mechanism and a guide rail for movably supporting the hand, the driving mechanism comprising a plurality of pulleys including a driving pulley supported rotatably around a horizontal axis and further comprising an output belt wound around the plurality of pulleys to be contained in a vertical plane for reciprocal movement within a predetermined section extending parallel to the movement path,
   wherein the hand is connected to the output belt via a connection member.

2. The transfer apparatus according to claim 1, wherein the driving mechanism includes a bevel gear mechanism arranged between the transmission shaft and the driving pulley.

3. The transfer apparatus according to claim 2, wherein the bevel gear mechanism includes a first bevel gear mounted to an end of the transmission shaft and a second bevel gear meshing with the first bevel gear for transmitting rotation of the transmission shaft to the driving pulley.

4. The transfer apparatus according to claim 2, wherein the driving mechanism further comprises a rotation shaft extending parallel to the rotation axis and a transmission section for transmitting rotation of the transmission shaft to the rotation shaft, and wherein the bevel gear mechanism includes a first bevel gear mounted to an end of the rotation shaft and a second bevel gear meshing with the first bevel gear for transmitting the rotation of the rotation shaft to the driving pulley.

5. The transfer apparatus according to claim 4, wherein the swivel includes an upper portion and a lower portion connected to each other to be vertically separable, and wherein the transmission section includes a linkage member supported by the upper portion rotatably around the rotation axis and an engagement member brought into engagement with the transmission shaft from above and removably connected to the linkage member.

6. The transfer apparatus according to claim 2, wherein the hand includes a first and a second hand which are movable along the movement path without interfering with each other, the driving mechanism including a first driving mechanism and a second driving mechanism for driving the first hand and the second hand respectively, the transmission shaft including a first transmission shaft and a second transmission shaft coaxially arranged correspondingly to the first and the second driving mechanism, the bevel gear mechanism including a first and a second bevel gear mechanism connected between the first and the second driving mechanism and the first and the second transmission shaft, respectively.

7. The transfer apparatus according to claim 6, wherein the first transmission shaft is inserted in the second transmission shaft.

8. The transfer apparatus according to claim 3, further comprising a deceleration mechanism arranged between the second bevel gear and the driving pulley.

* * * * *